(12) United States Patent
Hsu

(10) Patent No.: US 9,099,450 B2
(45) Date of Patent: Aug. 4, 2015

(54) PACKAGE STRUCTURE AND METHOD FOR MANUFACTURING SAME

(71) Applicant: Zhen Ding Technology Co., Ltd., Tayuan, Taoyuan (TW)

(72) Inventor: Shih-Ping Hsu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/084,627

(22) Filed: Nov. 20, 2013

(65) Prior Publication Data

US 2014/0300009 A1 Oct. 9, 2014

(30) Foreign Application Priority Data

Apr. 9, 2013 (CN) .......................... 2013 1 0120873 1

(51) Int. Cl.
| | |
|---|---|
| *H01L 23/48* | (2006.01) |
| *H01L 23/49* | (2006.01) |
| *H01L 23/00* | (2006.01) |
| *H05K 3/46* | (2006.01) |

(52) U.S. Cl.
CPC ................ *H01L 23/49* (2013.01); *H01L 24/43* (2013.01); *H05K 3/4691* (2013.01)

(58) Field of Classification Search
CPC ... H01L 24/43; H01L 23/49; H01L 27/14634; H05K 3/4691
See application file for complete search history.

(56) References Cited

U.S. PATENT DOCUMENTS

| | | | | |
|---|---|---|---|---|
| 5,838,546 | A | * | 11/1998 | Miyoshi .......................... 361/749 |
| 2011/0075384 | A1 | * | 3/2011 | Yeates ............................ 361/752 |
| 2011/0120754 | A1 | * | 5/2011 | Kondo et al. ................... 174/254 |

* cited by examiner

*Primary Examiner* — Ahmed Sefer
(74) *Attorney, Agent, or Firm* — Novak Druce Connolly Bove + Quigg LLP

(57) ABSTRACT

A package structure includes a flexible-rigid PCB and a chip. The flexible PCB includes a flexible PCB, a glue piece and an outer trace layer. The flexible PCB includes two bending portions and a fixing portion connected between the two bending portions, and includes an insulating layer and an inner trace layer formed on the insulating layer. The glue piece is adhered to the fixing portion. The outer trace layer is adhered to the glue piece and includes conductive pads. The fixing portion, the glue piece and the outer trace layer form a rigid portion, the bending portions form flexible portions. The chip is packaged on the rigid portion and includes electrode pads electrically connected to the conductive pads.

4 Claims, 5 Drawing Sheets

PACKAGE STRUCTURE AND METHOD FOR MANUFACTURING SAME

BACKGROUND

1. Technical Field

The present disclosure relates to a chip package structure and a method for manufacturing the chip package structure.

2. Description of Related Art

One kind of chip package structure includes a chip mounted on a rigid substrate and a printed circuit board (PCB) for carrying the rigid substrate. As the chip must be mounted on the rigid substrate first, then the rigid substrate with the chip can be mounted on the PCB, the process is complex and increases the manufacturing cost.

Another kind of chip package structure includes a chip directly mounted on a flexible PCB. Yet, as the PCB is flexible, it is not easy to mount the chip on the PCB.

Therefore, it is desirable to provide a package structure and a method for manufacturing the package structure which can overcome the shortcomings mentioned above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

FIGS. 1 to 4 show a method for manufacturing a package structure of the illustrated embodiment. The method includes steps described as below.

In step 1, a rigid-flexible PCB 100 is formed.

Figure 1:
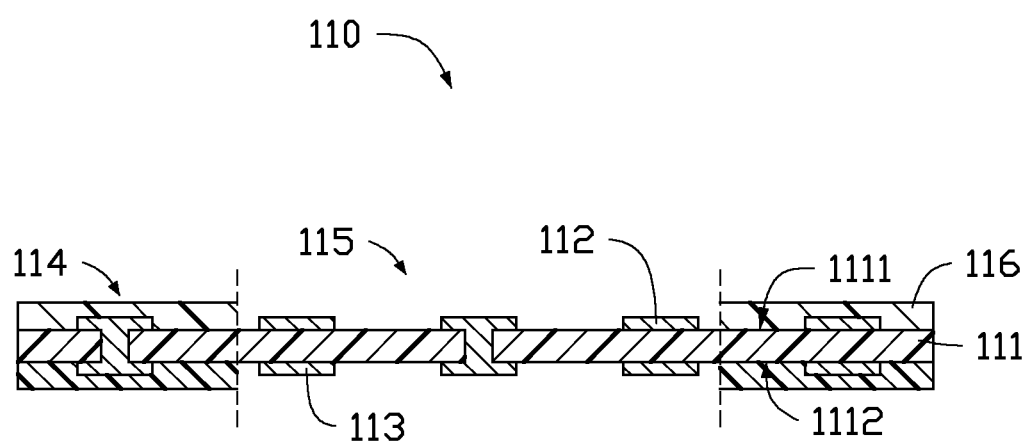
FIG. 1 is a sectional view of a flexible PCB according to a first embodiment of the present disclosure.

First, FIG. 1 shows a flexible PCB 110 is provided.

The flexible PCB 110 can be a single-sided board or a double-sided board. In this embodiment, the flexible PCB 110 is a double-sided board. The flexible PCB 110 includes a first insulating layer 111, a first trace layer 112 and a second trace layer 113. The first insulating layer 111 includes a first surface 1111 and a second surface 1112 opposite to the first surface 1111. The first trace layer 112 is formed on the first surface 1111. The second trace layer 113 is formed on the second surface 1112. The flexible PCB 110 includes a fixing portion 115 and two bending portions 114 connected to the fixing portion 115 at two opposite sides. The bending portions 114 are configured to form flexible portions of the rigid-flexible PCB 100.

The flexible PCB 110 further includes solder masks 116 formed at the bending portions 114 to protect the first trace layer 112 and the second trace layer 113 at the bending portions 114.

Figure 2:
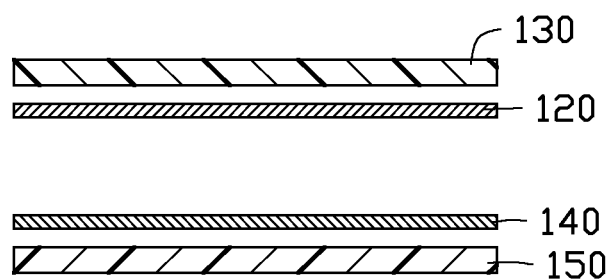
FIG. 2 is a sectional view of a first glue piece, a second glue piece, a first copper foil layer and a second copper foil layer according to the first embodiment of the present disclosure.
Figure 3:
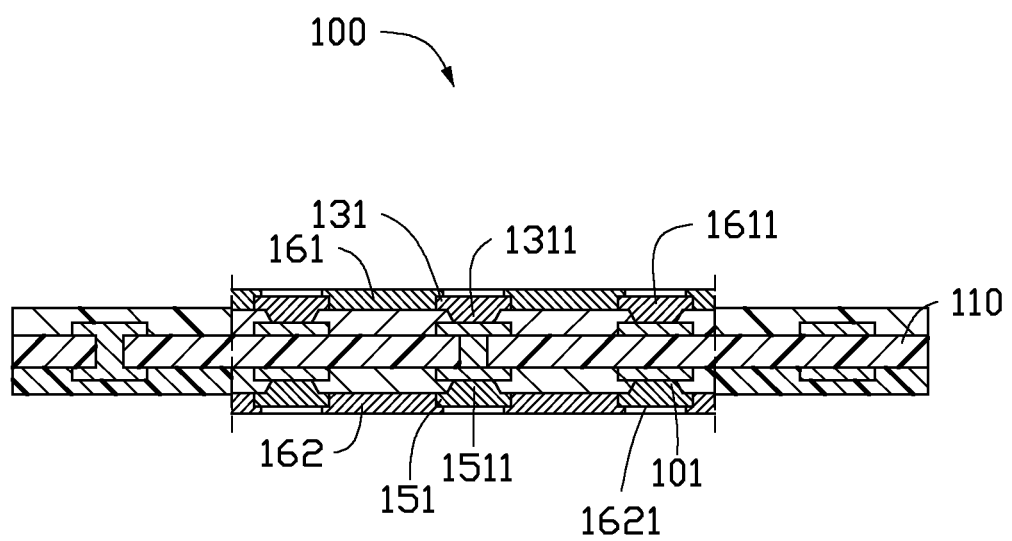
FIG. 3 is a sectional view of a rigid-flexible PCB according to the first embodiment of the present disclosure.

Second, FIGS. 2 and 3 show a first glue piece 120, a first copper foil layer 130, a second glue piece 140 and a second copper foil layer 150. The shape of the first and second glue pieces 120, 140 correspond to the shape of the fixing portion 115.

In this embodiment, the first and second glue pieces 120, 140 are semi-curable glue pieces.

Third, FIG. 3 shows the first copper foil layer 130, the first glue piece 120, the flexible PCB 110, the second glue piece 140 and the second copper foil layer 150 are laminated in sequence and pressed. The first and second glue pieces 120, 140 are aligned with the fixing portion 115 of the flexible PCB 110.

The first and second glue pieces 120, 140 are solidified after being pressed. The solidified first and second glue pieces 120 and the fixing portion 115 form a rigid portion of the rigid-flexible PCB.

At last, a first outer trace layer 131 is formed by processing the first copper foil layer 130, a second outer trace layer 151 is formed by processing the second copper foil layer 150, a first solder mask 161 is formed to cover the first outer trace layer 131, and a second solder mask 162 is formed to cover the second outer trace layer 151. In this way, the rigid-flexible PCB 100 is achieved.

In this embodiment, the first and second copper foil layers 130, 150 are processed by image transferring and etching to form the first and second outer trace layers 131, 151.

Before the first and second outer trace layers 131, 151 are formed, via 101 can also be formed to electrically connect the first copper foil layer 130 and the first trace layer 112, and to electrically connect the second copper foil layer 150 and the second trace layer 113.

The first outer trace layer 131 includes a number of first electric connecting pads 1311. The first solder mask 161 defines a number of first openings 1611. Each first electric connecting pad 1311 is exposed in one of the first openings 1611. The second outer trace layer 151 includes a number of second electric connecting pads 1511. The second solder mask 162 defines a number of second openings 1621. Each second electric connecting pad 1511 is exposed in one of the second openings 1621.

Before the first copper foil layer 130, the first glue piece 120, the flexible PCB 110, the second glue piece 140 and the second copper foil layer 150 are pressed, release films can be adhered to and cover two opposite sides of the bending portions 114. The release films can protect the trace layers at the bending portions 114 from being etching during the etching process. After the first and second outer trace layers 131, 151 are formed, the release films can be peeled off.

The first glue piece 120 and the second glue piece 140 can also cover the bending portions 114. After the first and second outer trace layers 131, 151 are formed, the first and second glue pieces 120, 140 corresponding to the bending portions 114 and the release films can be removed by de-cap process.

Figure 4:
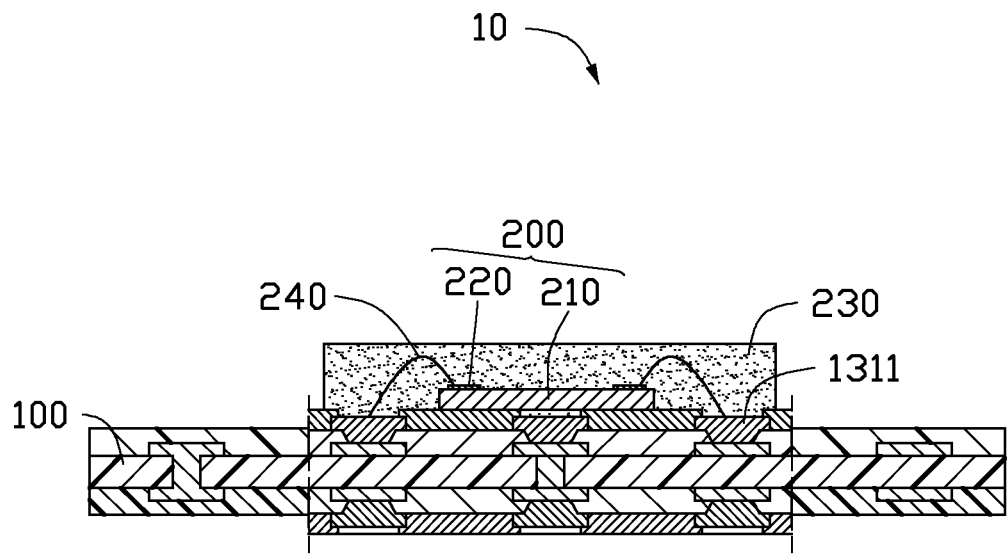
FIG. 4 is a sectional view of a package structure according to the first embodiment of the present disclosure.

In step 2, FIG. 4 shows a chip 200 is packaged on the rigid portion of the rigid-flexible PCB 100 to obtain a package structure 10.

The chip 200 includes a main body 210 and electrode pads 220 formed on the surface of the main body 210. The chip 200 can be packaged on the rigid-flexible PCB 100 by means of wire bonding. In detail, firstly, the chip 200 is adhered to a surface of the first solder mask 161 by a package glue 230, then bonding wires 240 are formed to electrically connect the first conductive pads 1311 to the electrode pads 220 by wire bonding, at last, the chip 200 and the bonding wires 240 are covered by package glue to protect the chip 200 and the bonding wires 240.

Figure 5:
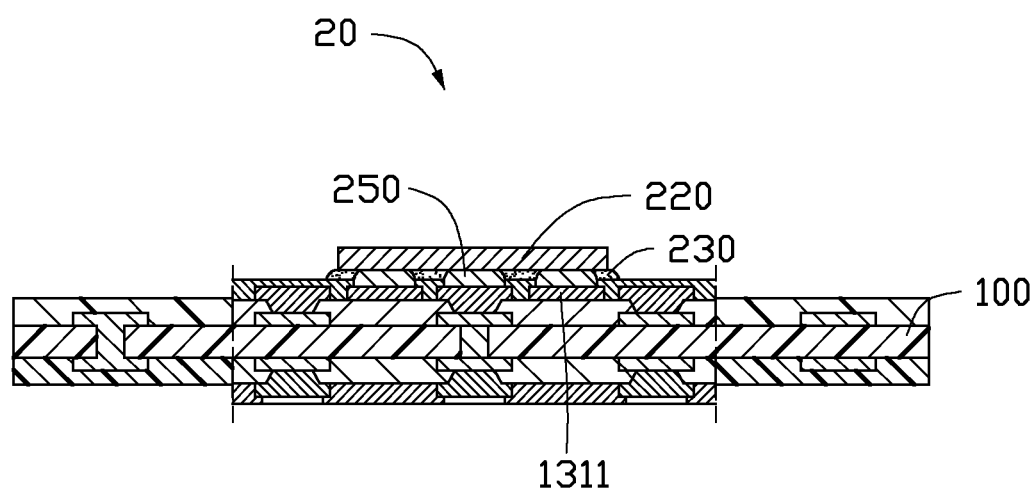
FIG. 5 is a sectional view of a package structure according to a second embodiment of the present disclosure.

In other embodiment, referring to FIG. 5, the chip 200 can be packaged on the rigid-flexible PCB 100 by means of flip chip packaging to obtain a package structure 20. The electrode pads 220 can be electrically connected to the first conductive pads 1311 by solder balls 250. The package glue 230 is also filled between the chip 200 and the rigid-flexible PCB 100 to firmly connect the chip 200 to the rigid-flexible PCB 100.

The chip is directly mounted to the rigid portion of the rigid-flexible PCB. Comparing to mount the chip on a rigid substrate then mount the rigid substrate to a PCB, the manufacturing step of the present disclosure is reduced. It is easier to mount the chip on the rigid portion of the rigid-flexible PCB.

It will be understood that the above particular embodiments are shown and described by way of illustration only. The principles and the features of the present disclosure may be employed in various and numerous embodiments thereof without departing from the scope of the disclosure. The above-described embodiments illustrate the scope of the disclosure but do not restrict the scope of the disclosure.

What is claimed is:

1. A method for manufacturing a package structure, comprising:

providing a flexible printed circuit board (PCB), the flexible PCB comprising two bending portions and a fixing portion connected between the two bending portions, the flexible PCB comprising an insulating layer and at least one inner trace layer formed on the insulating layer;

providing at least one glue piece and at least one copper foil layer, laminating and pressing the copper foil layer, the glue piece and the flexible PCB in sequence, the glue piece being adhered to the fixing portion and the copper foil layer;

processing the copper foil layer to obtain an outer trace layer, forming a via to electrically connect the outer trace layer to the inner trace layer, and thus obtaining a rigid-flexible PCB, the outer trace layer comprising a plurality of conductive pads, wherein the fixing portion, the glue piece and the outer trace layer form a rigid portion of the rigid-flexible PCB, the bending portions form flexible portions of the rigid-flexible PCB; and packaging a chip on the rigid portion, the chip comprising a plurality of electrode pads electrically connected to the conductive pads.

2. The method of claim 1, wherein chip is package on the rigid portion by wire bonding and the electrode pads are electrically connected to the conductive pads by bonding wires.

3. The method of claim 1, wherein chip is package on the rigid portion by flip chip packaging and the electrode pads are electrically connected to the conductive pads by solder balls.

4. The method of claim 1, further comprising covering a solder mask on the rigid portion before packaging the chip on the rigid portion, the solder mask defining a plurality of openings to expose the conductive pads.

* * * * *